United States Patent [19]

Flyer et al.

[11] Patent Number: 4,887,470
[45] Date of Patent: Dec. 19, 1989

[54] WIRE BOND FORCE CALIBRATION METER

[75] Inventors: Eric G. Flyer; Richard A. Krusing, both of Phoenix, Ariz.; Elmer L. Moseley, Ft. Worth, Tex.

[73] Assignee: Honeywell Inc., Minneapolis, Minn.

[21] Appl. No.: 231,406

[22] Filed: Aug. 12, 1988

[51] Int. Cl.[4] ............................ G01L 5/00; G01L 1/16
[52] U.S. Cl. .............................. 73/862.68; 73/862.54; 73/827
[58] Field of Search ............ 73/862.68, 862.67, 862.54, 73/DIG. 4, 862.64, 827

[56] References Cited

U.S. PATENT DOCUMENTS

| 3,572,108 | 3/1971 | McShone et al. | 73/827 |
| 3,724,264 | 4/1973 | Lac Valle | 73/827 |
| 4,572,309 | 2/1986 | Nishyama | 73/862.67 X |
| 4,660,481 | 4/1987 | Spickermann | 73/862.54 X |
| 4,786,860 | 11/1988 | Zimmerman | 73/827 X |
| 4,796,212 | 1/1989 | Kitagawa | 73/862.67 X |
| 4,807,482 | 2/1989 | Park et al. | 73/DIG. 4 |

FOREIGN PATENT DOCUMENTS 641306 1/1979 U.S.S.R. ............................ 73/827

OTHER PUBLICATIONS

"Self Test Ultrasonic Wire Bonding (Wire Bonding and Non-Destructive Pull Toshing by the Same Equipment)", Conference: Proceedings of the 29th Electronic Components Conference, Cherry Hill, N.J., U.S.A.; (14-16 May 1979); pp. 378-383; R. F. Unger et al.

Primary Examiner—Tom Noland
Attorney, Agent, or Firm—Howard Paul Terry

[57] ABSTRACT

A wire bonding force calibration meter for measuring automatically a force applied thereto and for displaying the value of the force is provided. The meter is particularly useful, in combination with a wire bonding machine, which bonds wires to silicon dice and to hybrid substrate pads by applying a force on the wires. The meter automatically measures the static setup force applied by the machine on the wires, and automatically measures the dynamic bonding force applied by the machine on the wires. The machine is used particularly for bonding wires in a hybrid. The meter overcomes the problem of manual measurement of the static setup force and the problem of not being able to measure the dynamic bonding force. The meter includes a transducer for sensing a force applied thereto, a charge amplifier connected to the transducer, a sample and hold unit connected to the charge amplifier, a converter connected to the sample and hold unit, and a memory unit connected to the converter and having a display for indicating the value of the applied force.

7 Claims, 11 Drawing Sheets

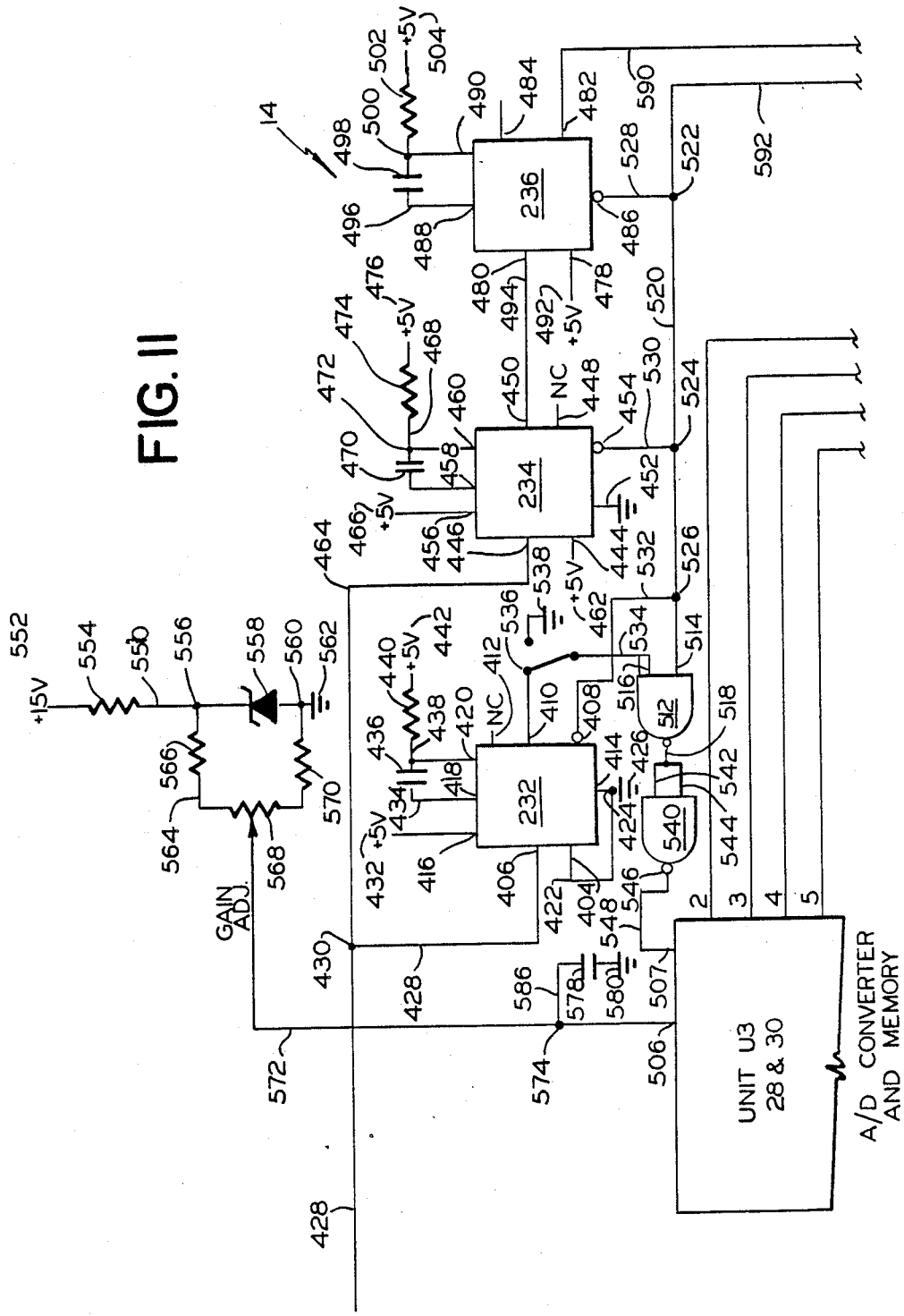

WIRE BOND FORCE CALIBRATION METER

The invention generally relates to a wire bond force calibration meter, and in particular the invention relates to a wire bond force calibration meter having a force transducer and a charge amplifier circuit and a sample and hold circuit and a display.

BACKGROUND OF THE INVENTION

The prior art wire bonding machine is a conventional wire bonding machine, which does not have a wire bond force calibration meter.

The prior art wire bonding machine is used for the interconnecting of silicon dice within a hybrid. This machine bonds fine wires, made of gold or aluminum, from pads on the dice to pads on the hybrid substrate. The prior art wire bonding machine applies forces by means of a bonding stylus. The bonding itself occurs in two steps. Initially a light setup force is applied. The purpose of this is merely to hold the wire in place in preparation for the actual bonding. After a brief time, a dynamic bonding force is applied. The values of these forces are variable, and depend generally on the gauge of the wire being used. The heavier the gauge, the more force is required. However, the amounts are somewhat critical. Excessive force can fracture a die, causing reliability problems; too little can yield a weak bond. The range of force values normally encountered is from 20 grams to 1000 grams. The force values are set by dials on the prior art wire bonding machine.

One problem with the prior art wire bonding machine is that there is no way to measure the dynamic bonding force with relative accuracy. Another problem is that there is no way to automatically measure the static setup force. The static setup force can only be measured manually using a mechanical gauge, which is held by the operator underneath the bonding stylus during the initiation of the bond. The results obtained in this way are inconsistent, and are dependent upon operator dexterity to maintain the position of the gauge properly. The dynamic bonding force, which is transient in nature, lasting only 50 milliseconds in a typical case, cannot be measured with relative accuracy.

SUMMARY OF THE INVENTION

According to the present invention, a wire bond force calibration meter for a wire bonding machine is provided. The meter has a piezoelectric force transducer, a charge amplifier, which generates a DC voltage proportional to the applied force; a sample and hold circuit, which captures the voltage; and an analog-to-digital converter, which takes the sample and hold output voltage, and which converts it to binary-coded decimal, and which displays it on a liquid crystal readout, that has a display showing the force directly in grams. With the wire bonding assembly according to the invention, the operator can automatically measure the static setup force and the dynamic bonding force. Thus, the problems of the prior art wire bonding machine are overcome by the assembly of the meter and the machine.

BRIEF DESCRIPTION OF THE DRAWINGS

The above advantages and subsequent description will be more readily understood by reference to the following drawings:

FIG. 11 is an enlarged view of a portion of FIG. 7.

DESCRIPTION OF THE PREFERRED EMBODIMENTS

Figure 1:
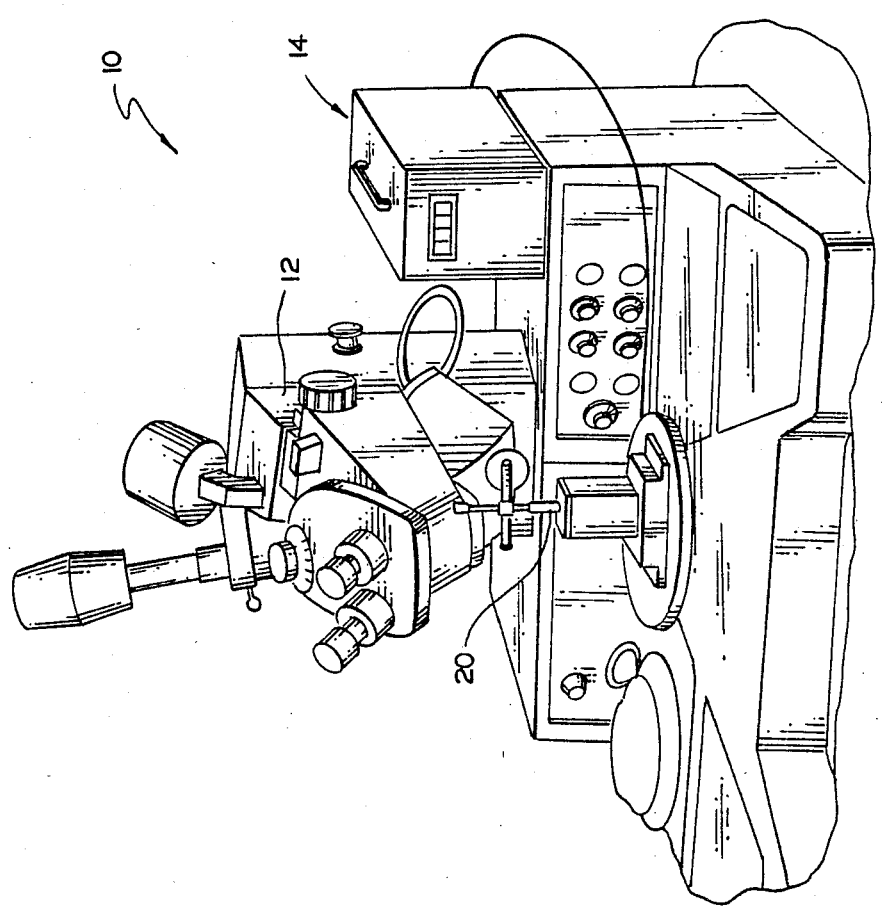
FIG. 1 is a perspective view of an assembly of a wire bonding machine and wire bond force calibration meter according to the invention.
Figure 2:
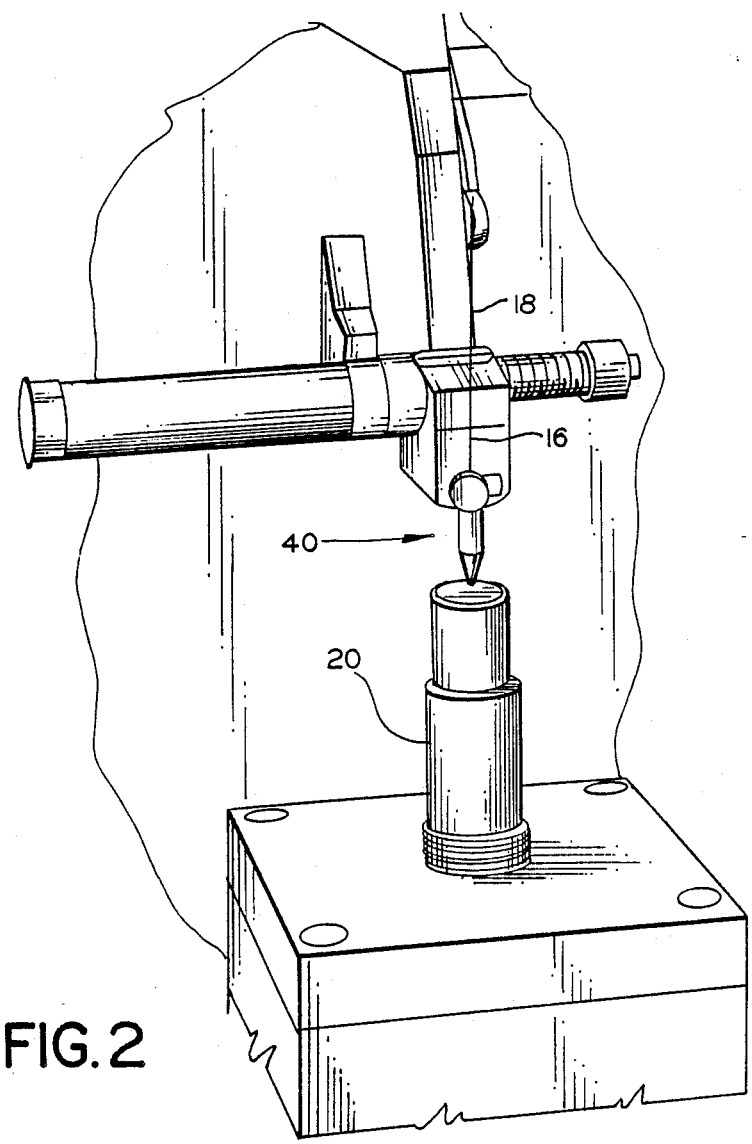
FIG. 2 is a perspective view of a portion of FIG. 1.

As shown in FIG. 1, a wire bonding assembly 10 is shown. Assembly 10 includes a modified wire bonding machine 12, and a wire bonding force calibration meter 14 for measuring the force on wire 16.

Figure 4:
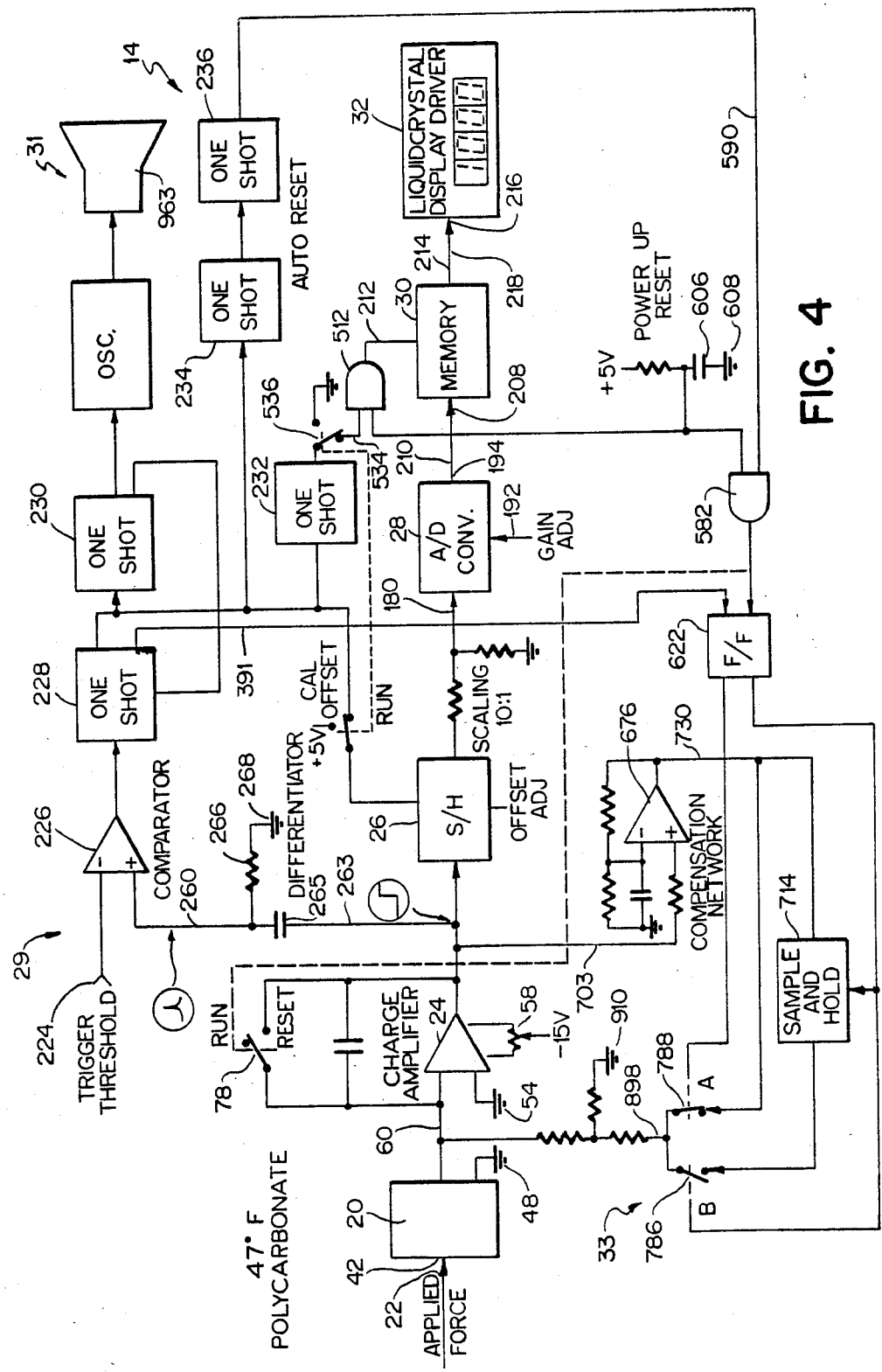
FIG. 4 is a block diagram of the wire bond force calibration meter.

As shown in FIG. 4, meter 14 includes a piezoelectric force transducer 20, which senses a wire bond force or applied force 22 that is applied to transducer 20, and a charge amplifier 24, which acts in combination with transducer 20, and which generates a voltage that is proportional to force 22. Meter 14 also includes a sample and hold unit 26, which captures such voltage, and an analog to digital converter 28, which takes the voltage from sample and hold unit 26 and which converts the voltage to a binary coded decimal. Meter 14 also includes a memory unit 30 which receives the data, and a liquid crystal display and driver unit 32, which shows the value of the force 22 in grams.

Figure 3:
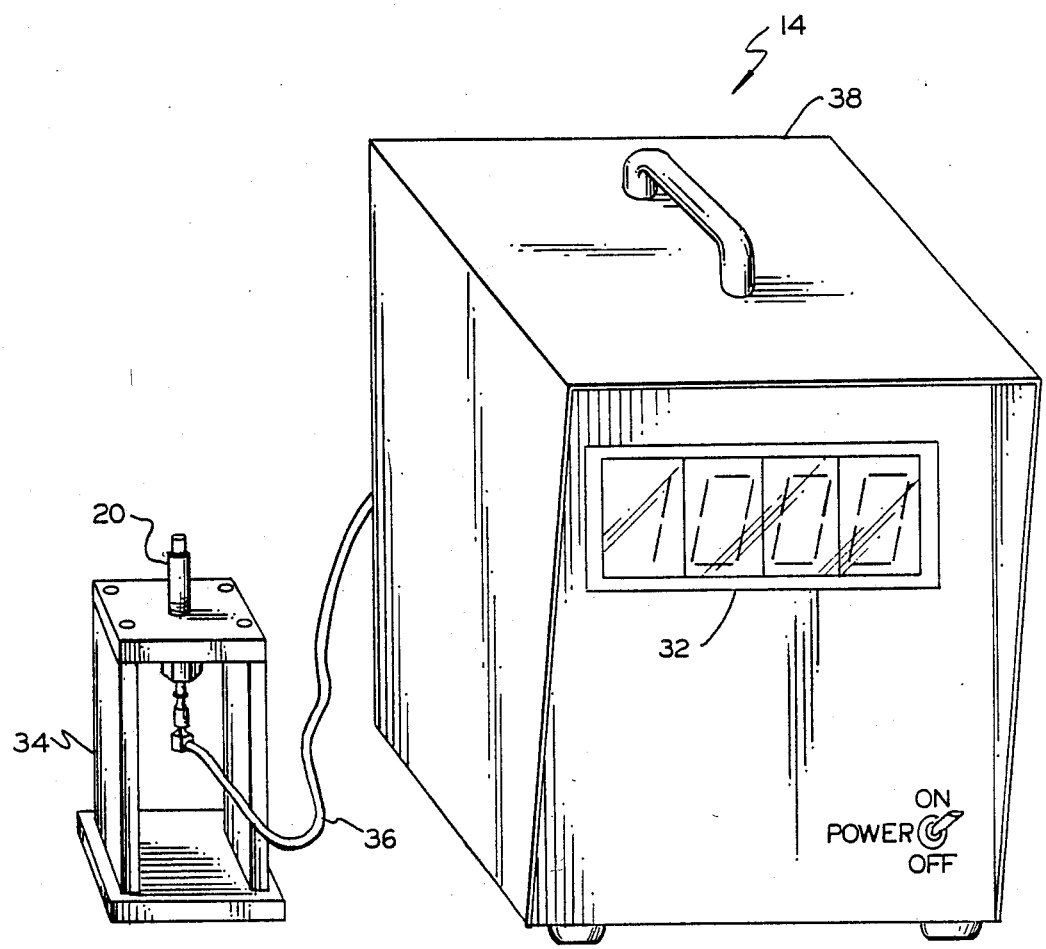
FIG. 3 is a perspective view of another portion of FIG. 1.

In FIG. 3, meter 14 has a support frame 34, which supports transducer 20, and has a cable 36, which connects to transducer 20, and has a case 38, which connects to cable 36. Machine 12 has a stylus 40, which is disposed above transducer 20 and which bonds wire 16.

In FIG. 4, meter 14 also has a timing circuit 29, an event annunciator circuit 31, and a compensation feedback circuit 33, as explained hereafter.

Figure 5:
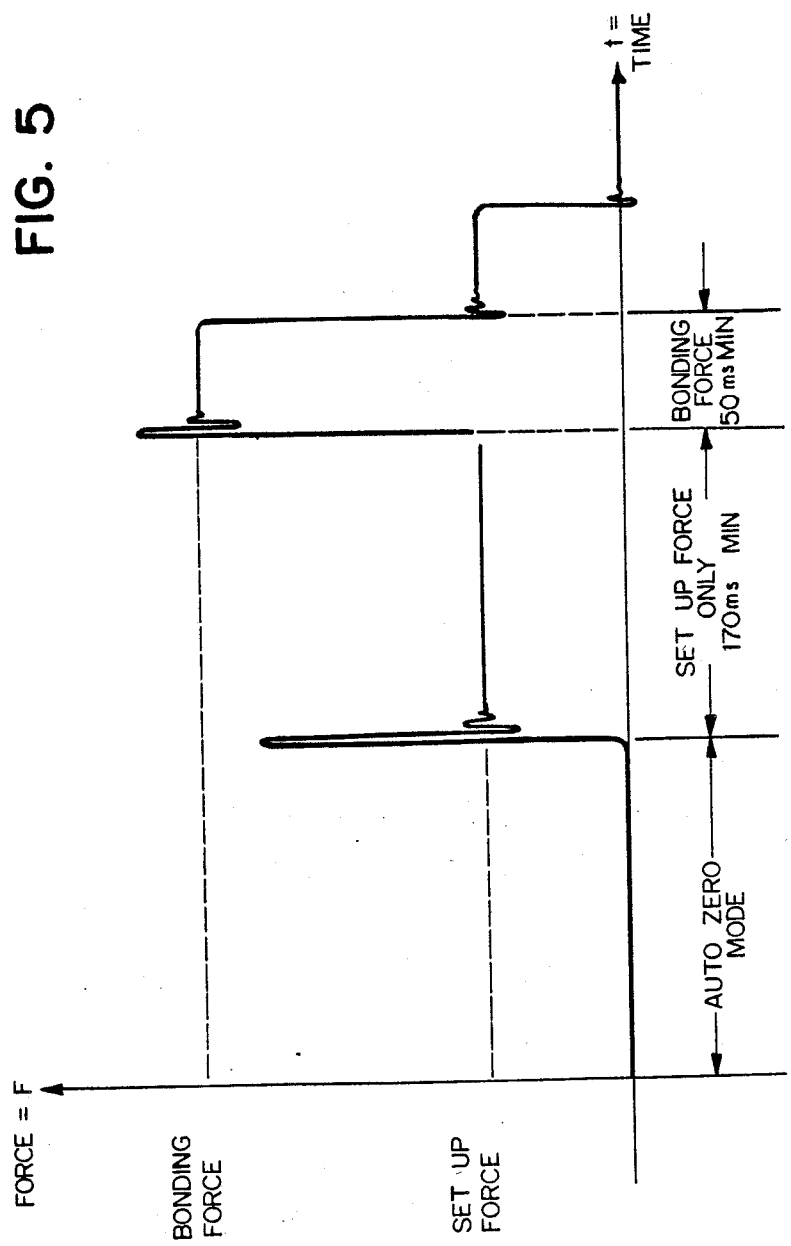
FIG. 5 is an output waveform of a portion of FIG. 4.

In FIG. 5, a curve of applied force versus time, as read at the output of the charge amplifier 24, is shown.

Figure 6:
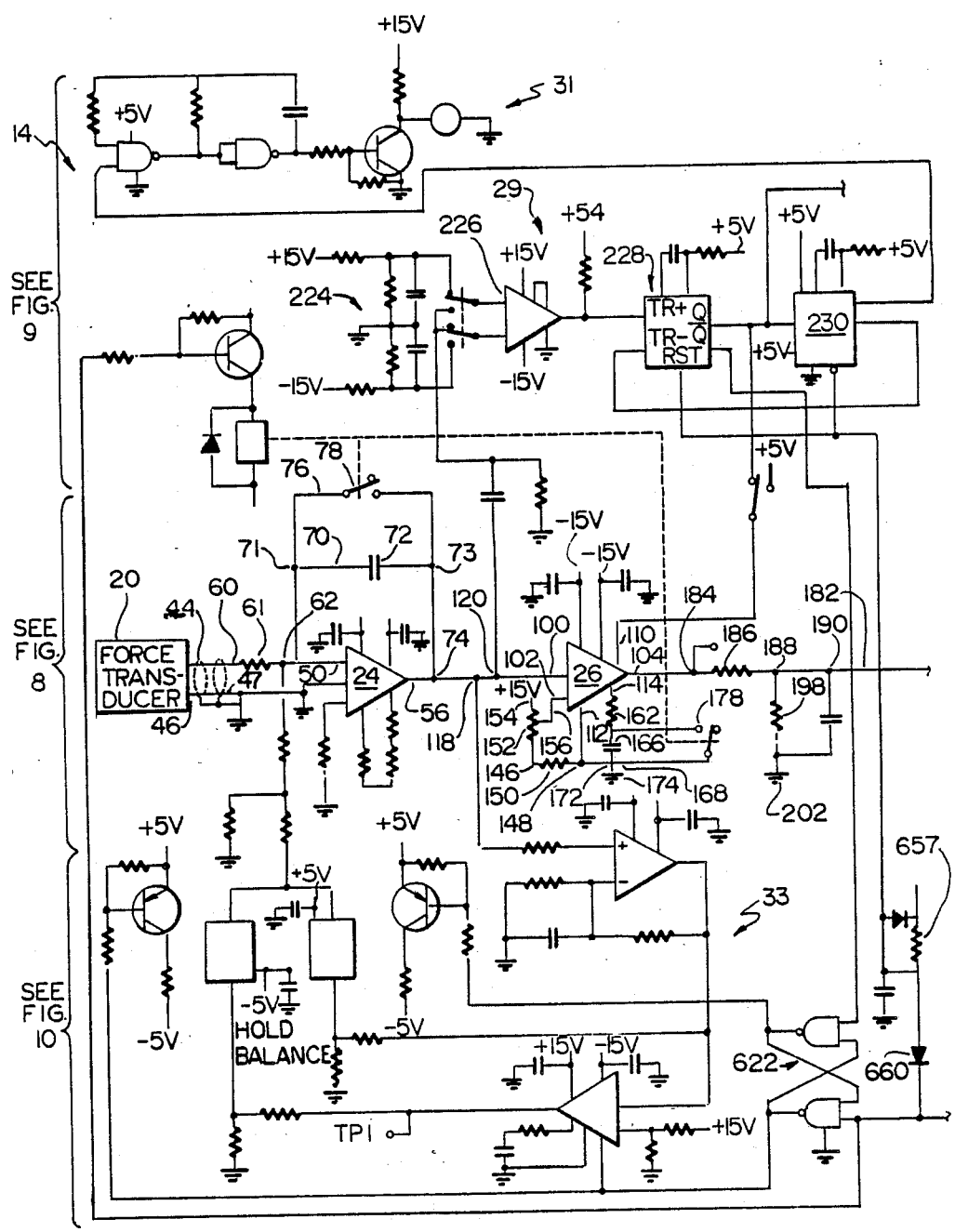
FIG. 6 is a leftside part of a circuit drawing corresponding to the block diagram of FIG. 4.
Figure 7:
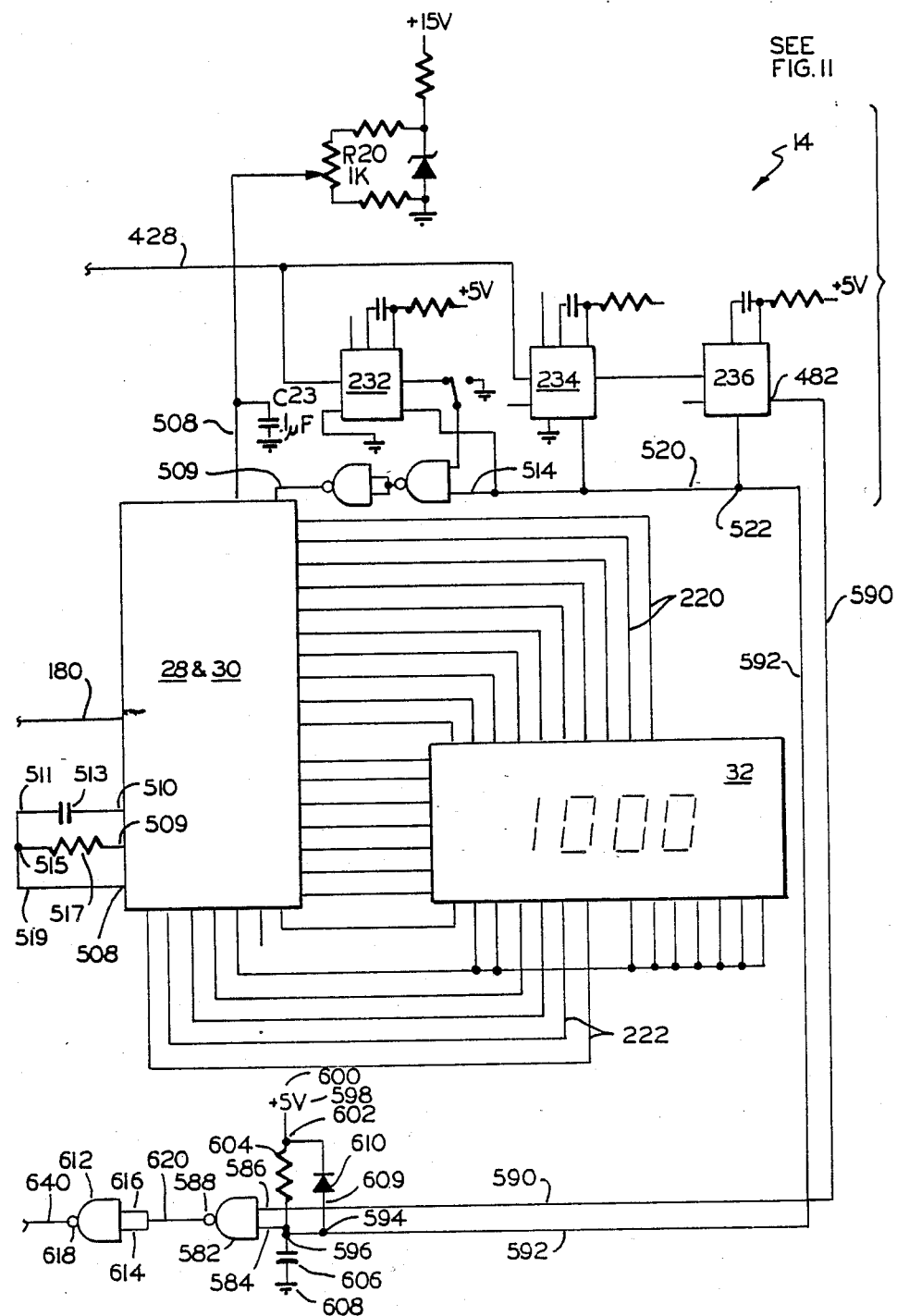
FIG. 7 is a rightside part of the circuit drawing of FIG. 6.
Figure 8:
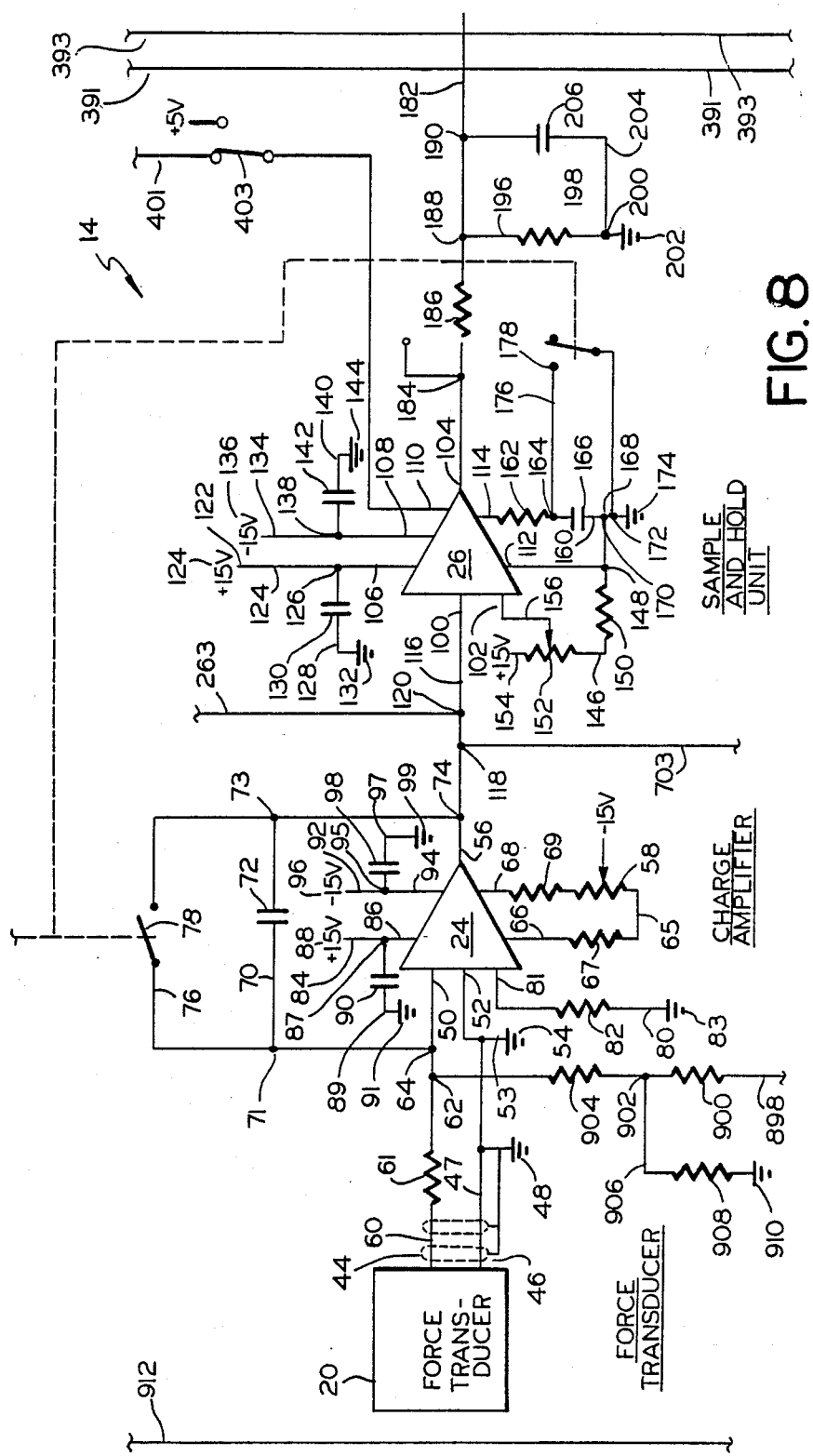
FIG. 8 is an enlarged view of a portion of FIG. 6.
Figure 9:
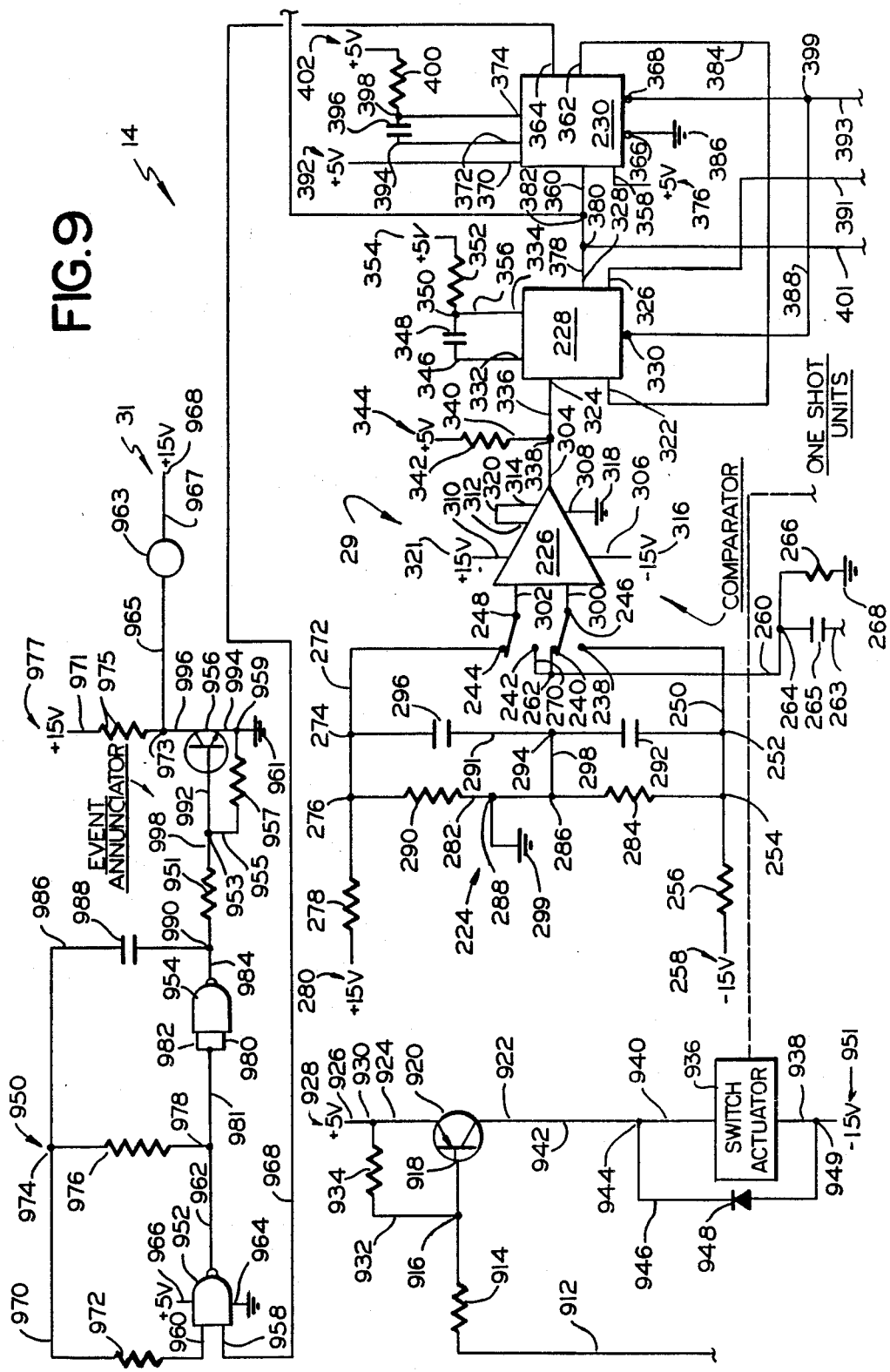
FIG. 9 is another enlarged view of another portion of FIG. 6.
Figure 10:
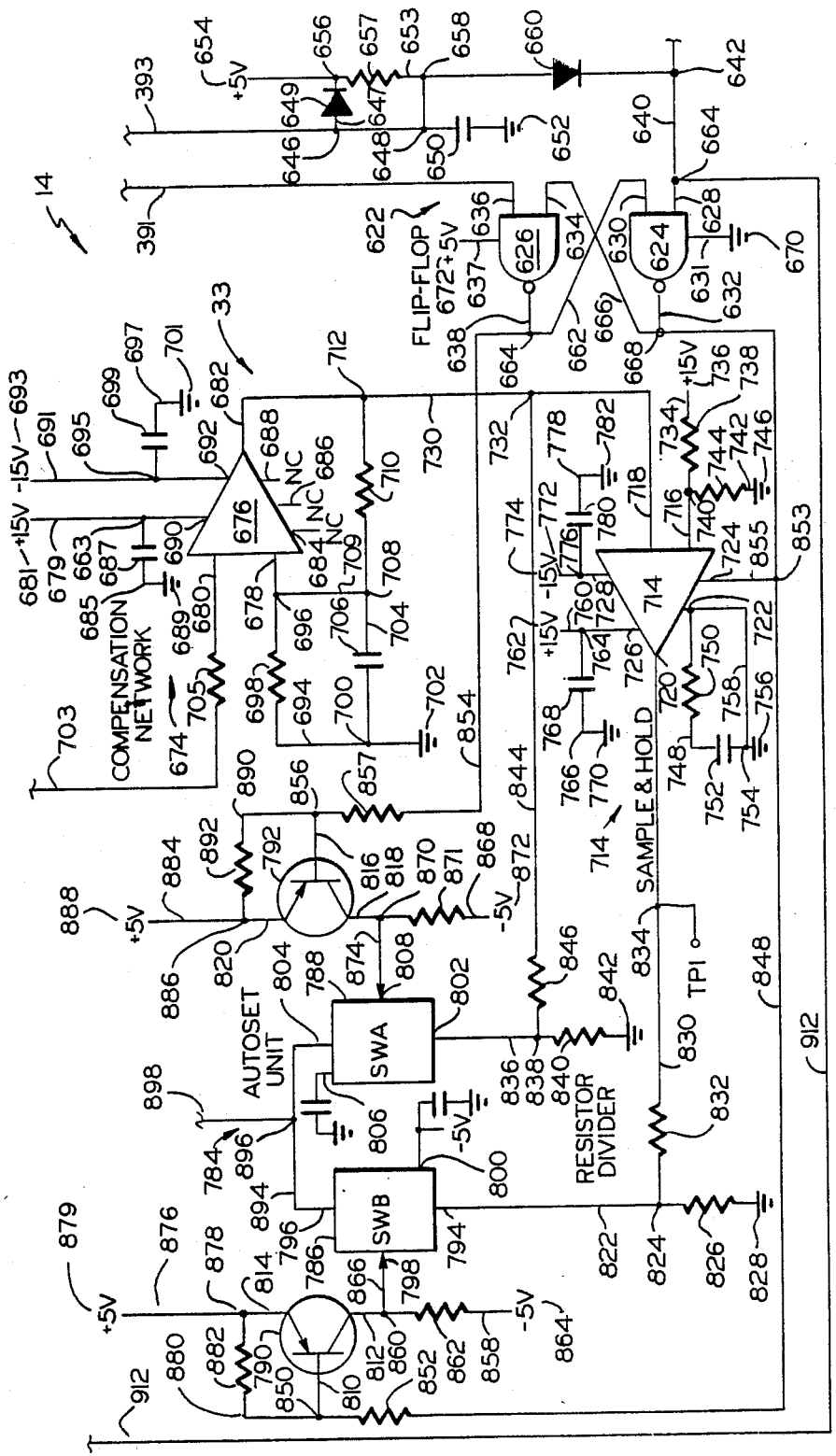
FIG. 10 is another enlarged view of still another portion of FIG. 6.

FIG. 9 is an enlarged view of the upper third portion of FIG. 6. FIG. 8 is an enlarged view of the middle third portion of FIG. 6. FIG. 10 is an enlarged view of the lower third portion of FIG. 6. FIG. 11 is an enlarged view of the upper third portion of FIG. 7.

In FIGS. 4, 6 and 8 the transducer 20 has an input portion 42 which receives force 22, a first output terminal 44, and a second output terminal 46 which connects to ground 48.

In FIGS. 4, 6 and 8, charge amplifier 24 includes a first input terminal 50 and a second input terminal 52. A connector 53 extends from terminal 52 to ground 54. Charge amplifier 24 also has a first output terminal 56 and a balance coarse adjusting resistor 58 as explained hereafter. Charge amplifier 24 includes a connector 60, which extends from terminal 44, through a resistor 61, through a first junction 62, through a second junction 64 to terminal 50. A connector 65 extends from a lower terminal 66, through a resistor 67, through balance coarse adjusting resistor 58, through a resistor 69, to a lower terminal 68.

A connector 70 extends from a junction 64, through a junction 71, through a capacitor 72, through a junction 73 to a junction 74, which is next to terminal 56. A connector 76 extends from junction 71, through a reset unit 78, to junction 73. A connector 80 extends from an input terminal 81, through a resistor 82, to a ground 83. A connector force 84 from an upper terminal 86, through a junction 87 to a +15 volt source 88. A connector 89 extends from junction 87, through a capacitor 90 to a ground 91. A connector 92 extends from an upper terminal 94, through a junction 95 to a −15 volt source 96. A connector 97 extends from junction 95, through a capacitor 98, to a ground 99.

As shown in FIGS. 4, 6 and 8, sample and hold circuit 26 includes a first input terminal 100, a second input terminal 102, an output terminal 104, an upper terminal 106, an upper terminal 18, an upper terminal 110, a lower terminal 112, and a lower terminal 114.

Sample and hold circuit 26 also includes a connector 116, which extends from terminal 56, through junction 74, through a junction 118, and through a junction 120, to input terminal 100. A connector 122 extends from a +15 volt source 124, through a junction 126, to upper terminal 106. A connector 128 extends from junction 126, through a capacitor 130, to a ground 132. A connector 134 extends from a −15 volt source 136, through a junction 138, to upper terminal 108. A connector 140 extends from junction 138, through a capacitor 142, to a ground 144.

A connector 146 extends from lower terminal 112, through a junction 148, through a resistor 150, through an offset adjusting resistor 152 to a +15 volts source 154. A connector 156 extends from resistor 152, to second input terminal 102.

A connector 160 extends from lower terminal 114, through a resistor 162, through a junction 164, through a capacitor 166, through a junction 168, to junction 148. A connector 170 extends from junction 168, through a junction 172 to a ground 174. A connector 176 extends from junction 164, through a reset unit 178, to junction 172.

Converter 28, as shown in FIG. 4, has an input terminal 180. A connector 182 in FIG. 8 extends from terminal 104, through a junction 184, through a resistor 186, through a junction 188, through a junction 190, to terminal 180.

Converter 28 also has a gain adjusting input terminal 192 and an output 194 in FIG. 4. A connector 196 in FIG. 8 extends from junction 188, through a resistor 198, through a junction 200, to a ground 202. A connector 204 extends from junction 200, through a capacitor 206, to terminal 190.

Memory 30, as shown in FIG. 4, has an input 208, and has a line 210, which extends from terminal 194 to input 208. Memory 30 also has an upper input 212 and an output 214.

Display 32, as shown in FIG. 4, has an input 216, and has a line 218, which extends from output 214 to input 216. Line 218, as shown in FIG. 4, represents a plurality of connectors 220, 222, as shown in FIG. 7.

As shown in FIGS. 4, 6 and 9, timing circuit 29 includes a trigger threshold unit 224, a comparator 226, and a chain of one-shot units 228, 230, 232, 234, 236. In FIG. 9, trigger threshold unit 224 includes four terminals 238, 240, 242, 244 and two switches terminals 246, 248. A connector 250 extends from terminal 238 through a junction 252, through a junction 254, through a resistor 256 to a −15 volt source 258. A connector 260 extends from terminal 240 through a junction 262, through a junction 264, through a resistor 266 to a ground 268. A connector 263 extends from terminal 264, through a capacitor 265 to terminal 120 in FIG. 8.

A connector 270 extends from terminal 242 to terminal 262. A connector 272 extends from terminal 244, through a junction 274, through a junction 276, through a resistor 278 to a +15 volt source 280. A connector 282 extends from terminal 254 through a resistor 284, through a junction 286, through a junction 288, through a resistor 290, to junction 276. A connector 291 extends from junction 252 through a capacitor 292, through a junction 294, through a capacitor 296 to junction 274. A connector 298 extends from junction 294 to junction 286. Junction 288 connects to ground 299.

Comparator 226 includes two input terminals 300, 302, an output terminal 304, two lower terminals 306, 308, and three upper terminals 310, 312, 314. Terminal 300 is connected to terminal 246. Terminal 302 is connected to terminal 248. Terminal 306 is connected to a −15 volt source 316. Terminal 308 is connected to a ground 318. A connector 320 extends from terminal to terminal 314. Terminal 310 connects to a +15 volt source 321.

As shown in FIG. 9, one-shot unit 228 includes two input terminals 322, 324, two output terminals 326, 328, a lower terminal 330, and two upper terminals 332, 334. A connector 336 extends from terminal 304, through a junction 338, to terminal 324. A connector 340 extends from terminal 338, through a resistor 342, to a +5 volt source 344. A connector 346 extends from terminal 332, through a capacitor 348, through a junction 350, through a resistor 352, to a +5 volt source 354. A connector 356 extends from terminal 334 to terminal 350.

As shown in FIG. 9, one-shot unit 230 includes two input terminals 358, 360, two output terminals 362, 364, two lower terminals 366, 368, and three upper terminals 370, 372, 374. Terminal 358 connects to a +5 volt source 376. A connector 378 extends from terminal 328, through a junction 380, through a junction 382, to terminal 360. A connector 384 extends from terminal 362 to terminal 322. Terminal 366 is connected to a ground 386. A connector 388 extends from terminal 368 through a junction 390 to terminal 330. A connector 391 extends from terminal 326 to unit 33 in FIG. 10 as explained hereafter. Terminal 370 connects to a +5 volt source 392. A connector 393 extends from terminal 368 to unit 33 in FIG. 10. A connector 394 extends from terminal 372, through a capacitor 396, through a junction 398, through a resistor 400, to a +5 volt source 402. Terminal 374 is connected to junction 398. A connector 401 extends from terminal 380 in FIG. 9, through a switch 403 to terminal 110 in FIG. 8.

As shown in FIG. 11, one-shot unit 232 includes three input terminals 404, 406, 408, two output terminals 410, 412, a lower terminal 414, and three upper terminals 416, 418, 420. A connector 422 extends from terminal 404 through a junction 424 to terminal 414. A ground 426 connects to junction 424. A connector 428 extends from terminal 406, through a junction 430 to terminal 382, which is next to one-shot unit 230 in FIG. 9. Terminal 416 is connected to a +5 volt source 432. A connector 434 extends from terminal 418, through a capacitor 436, through a junction 438, through a resistor 440, to a +5 volt source 442.

In FIG. 11, one-shot unit 24 includes three input terminals 444, 446, 454 two output terminals 448, 450, one lower terminal 452, and three upper terminals 456, 458, 460. Terminal 444 connects to a +5 volt source 462. A connector 468 extends from terminal 446 to junction 430. Terminal 456 connects to a +5 volt source 446. A connector 468 extends from terminal 458, through a capacitor 470, through a junction 472, through a resistor 474, to a +5 volt source 476. Terminal 460 is connected to junction 472.

In FIG. 11, one-shot unit 236 includes three input terminals 478, 480, 486, two output terminals 482, 484, and two upper terminals 488, 490. Terminal 478 connects to a +5 volt source 492. A connector 494 extends from terminal 480 to terminal 450. A connector 496 extends from terminal 488, through a capacitor 498, through a junction 500, through a resistor 502, to a +5 volt source 504. Terminal 490 is connected to junction 500.

In FIG. 7 and 11, memory 30 of combination unit U3 has upper terminals 506, 507, and side terminals 508, 509, 510. A connector 511 in FIG. 7 extends from terminal 510, through a capacitor 513, through a junction 515, through a resistor 517 to terminal 509. A connector 519 connects junction 515 to terminal 508.

In FIG. 11, a logic element 512 has two input terminals 514, 516 and an output terminal 518. A connector 520 extends from terminal 486, through a junction 522, through a junction 524, through a junction 526 to input terminal 514. A connector 528 extends from junction 522 to terminal 486. A connector 530 extends from junction 524 to terminal 454. A connector 532 extends from junction 526 to terminal 408. A connector 534 extends from terminal 516, through a switch 536, to terminal 410. Switch 536 connects to a ground 538.

A logic element 540 has two input terminals 542, 544, and an output terminal 546. A connector 548 extends from terminal 546 to terminal 507. Input terminals 542, 544 are connected to output terminal 518.

In FIG. 11, a connector 550 extends from a +15 volt source 552, through a resistor 554, through a junction 556, through a zener diode 558, through a junction 560, to a ground 562. A connector 564 extends from junction 556, through a resistor 566, through a gain adjusting resistor 568, through a resistor 570, to junction 560. A connector 572 extends from resistor 568, through a junction 574, to terminal 506. A connector 576 extends from junction 574, through a capacitor 578, to a ground 580.

In FIG. 7, at the bottom thereof, a logic element 582 includes two input terminals 584, 586 and an output terminal 588. A connector 590 extends from terminal 482 to terminal 586. A connector 592 extends from terminal 522 in FIG. 11, through junction 594, through junction 596, to terminal 584. A connector 598 extends from a +5 volt source 600, through a junction 602, through a resistor 604, through a junction 596, through a capacitor 606, to a ground 608. A connector 609 extends from junction 594 through a diode 610, to junction 602.

Another logic element 612 has two input terminals 614, 616, and an output terminal 618. A connector 620 extends from terminal 588 to both terminals 614, 616. Terminal 618 connects to circuit 33 in FIG. 10 as explained hereafter.

In FIGS. 4, 6 and 10, a flip flop unit 622 is shown, which has two logic elements 624, 626. Element 624 has two input terminals 628, 630, another terminal 631, and an output terminal 632. Element 626 has two input terminals 634, 636, another terminal 637, and an output terminal 638.

A connector 640 extends from terminal 618 in FIG. 7, through junction 642, through junction 664, to terminal 628. Connector 393 extends from junction 390 in FIG. 9, through a junction 646 in FIG. 10, through a junction 648, through a capacitor 650, to a ground 652. In FIG. 10, a connector 653 extends from a +5 volt source 654, through a junction 656, through a resistor 657, through a junction 658, through a diode 660, to terminal 642. A connector 662 extends from terminal 638, through junction 664, to terminal 630. A connector 666 extends from terminal 634, through junction 668, to terminal 632. Terminal 631 connects to a ground 670. Terminal 637 connects to a +5 volt source 672. Junction 648 is connected to junction 658. A connector 647 extends from junction 646, through a diode 649, to junction 656.

In FIG. 10, a compensation network 674 is provided, which includes a compensation unit 676. Unit 676 has two input terminals 678, 680, and output terminal 682, three lower terminals 684, 686, 688, and two upper terminals 690, 692. A connector 694 extends from terminal 678 through a junction 696, through a resistor 698, through a junction 700, to a ground 702. A connector 704 extends from junction 700, through a capacitor 706, through a junction 708, through a resistor 710, through a junction 712, to terminal 682. A connector 709 connects junctions 696 and 708.

In FIG. 10, in network 674, a connector 679 extends from a +15 volt source 681, through a junction 663, to terminal 690. A connector 685 extends from junction 663 through a capacitor 687 to a ground 689.

In FIG. 10, a connector 691 extends from a −15 volt source 693, through a junction 695, to terminal 692. A connector 697 extends from terminal 695, through a capacitor 699, to a ground 701. A connector 703 extends from terminal 680, through a resistor 705, to a terminal 118 in FIG. 8.

In FIG. 10, a feedback sample and hold unit 714 is provided which includes two input terminals 716, 718, an output terminal 720, two lower terminals 722, 724, and two upper terminals 726, 728. A connector 730 extends from junction 712, through a junction 732, to terminal 718. A connector 734 extends from a +15 volt source 736, through a resistor 738, through a junction 740, to terminal 716.

A connector 742 extends from junction 740, through a resistor 744, to a ground 746. A connector 748 extends from terminal 722, through a resistor 750, through a capacitor 752, through a junction 754, to a ground 756. A connector 758 extends from junction 754 to terminal 722. A connector 760 extends from a +15 volt source 762 through a junction 764 to terminal 726. A connector 766 extends from junction 764, through a capacitor 768, to a ground 770. A connector 772 extends from a −15 volt source 774, through a junction 776, to terminal 728. A connector 778 extends from junction 776, through a capacitor 780, to a ground 782.

In FIG. 10, an autoset unit 784 is provided. Unit 784 includes a left switch 786, a right switch 788, a left semiconductor 790, and a right semiconductor 792. Left switch 786 includes an input terminal 794, an output terminal 796, a left terminal 798 and a right terminal 800. Right switch 788 includes an input terminal 802, an output terminal 804, a top terminal 806 and a right terminal 808. Left semiconductor 790 has a left terminal 810, a bottom terminal 812 and a top terminal 814. Right semiconductor 792 has a right terminal 816, a bottom terminal 818 and a top terminal 820.

A connector 822 extends from terminal 794, through a junction 824, through a resistor 826, to a ground 828. A connector 830 extends from junction 824, through a resistor 832, through a junction 834, to terminal 720. A connector 836 extends from terminal 802, through a junction 838, through a resistor 840, to a ground 842. A connector 844 extends from junction 838, through a resistor 846, to junction 732. A connector 848 extends from terminal 810, through a junction 850, through a resistor 852, through a junction 853, to junction 668. A connector 855 connects junction 853 to terminal 724. A junction 856, through a resistor 857, to junction 664. A connector 858 extends from terminal 812, through a junction 860, through a resistor 862, to a −5 volt source 864. A connector 866 extends from junction 860 to terminal 798.

In FIG. 10, a connector 868 extends from terminal 818, through a junction 870, through a resistor 871, to a −5 volt source 872. A connector 874 extends from terminal 808 to junction 870. A connector 876 extends from terminal 814, through a junction 878, to a +5 volt source 879. A connector 880 extends from junction 878, through a resistor 882, to terminal 850. A connector 884 extends from terminal 820, through a junction 886, to a +5 volt source 888. A connector 890 extends from terminal 886, through a resistor, 892, to junction 856. A connector 894 extends from terminal 796, through a junction 896, to terminal 804. A connector 898 extends from junction 896 in FIG. 10, through a resistor 900 in FIG. 8, through a junction 902, through a resistor 904, to junction 62. In FIG. 8, a connector 906 extends from junction 902, through resistor 908, to a ground 910.

In FIG. 10, a connector 912 extends from junction 664, through FIG. 8, and in FIG. 9, through a resistor 914, through a junction 916 in FIG. 9 to a left terminal 918 of a semiconductor 920. Semiconductor 920 has a bottom terminal 922 and a top terminal 924. A connector 926 extends from a +5 volt source 928, through a junction 930, to terminal 924. A connector 932 extends from junction 930, through a resistor 934, to junction 916.

In FIG. 9, a switch actuator 936 is shown, which has a lower terminal 938 and an upper terminal 940. A connector 942 extends from upper terminal 940, through a junction 944, to terminal 922. A connector 946 extends from junction 944, through a diode 948, through junction 949, to terminal 938. Junction 949 connects to a −15 volt source 951. A dash line in FIG. 9 shown how actuator 936 schematically actuates the switch of terminal 178 in FIG. 8. Actuator 936 also actuates switch 78 in FIG. 8, as shown by the dash line, at the top of FIG. 8.

In FIG. 9, an event annunciator 950 is shown. Annunciator 950 includes a logic element 952, a logic element 954, and a semiconductor 956. Logic element 952 has two input terminals 958, 960, one output terminal 962, a lower terminal 964, and an upper terminal 966. A connector 968 extends from terminal 958 to terminal 364. A connector 970 extends from terminal 960, through a resistor 972, through a junction 974, through a resistor 976, through a junction 978, to terminal 962.

Logic element 954 has two input terminals 980, 982, and an output terminal 984. A connector 986 extends from junction 974, through a capacitor 988, through a junction 990, to terminal 984. A connector 981 connects terminals 980, 982 to junction 978.

In FIG. 9, semiconductor 956 has a left terminal 992, a lower terminal 994, and an upper terminal 996. A connector 998 extends from junction 990, through a resistor 951, through a junction 953, to terminal 992. A connector 955 extends from junction 953, through a resistor 957, through a junction 959, to terminal 994. A ground 961 is connected to junction 959.

A piezoelectric sound transducer 963 has a left terminal 965, and a right terminal 967. A +15 volt supply 969 connects to terminal 967. A connector 971 extends from terminal 996, through a junction 973, through a resistor 975, to a +15 volt source 977. Terminal 965 is connected to junction 973.

The operation of the circuit of the wire bond force calibration meter 14 is indicated hereafter. The heart of force calibration meter 14 is charge amplifier 24, shown in the block diagram of FIG. 4. Piezoelectric force transducer 20 delivers a charge impulse proportional to the value of applied force 22. The charge q generated by transducer 20 is stored on the feedback capacitor 72 with a capacitance of c=47 picofarad. This results in an output voltage equal to q/c. Transducer 20 has a nominal sensitivity S of 215 picocoulombs/lb. Therefore, the output voltage is given by $$V = (S/C)F = (215 \text{ picocoul/lb}) \times (1 \text{ lb}/453.59 \text{ grams}) \times$$

$$(F)/(47 \text{ picofarad})$$

where F is the applied force in grams. Therefore $$V/F = 10 \text{ volts}/1000 \text{ grams}$$

This allows for a full scale range of 1000 grams for meter 14. Capacitor 72 is a low leakage type, such as a polycarbonate, so that the charge is maintained long enough for sample and hold unit 26 to capture the corresponding voltage. Also, operational amplifier 24 has extremely low bias currents to ensure that the latter do not affect the charge held on capacitor 72 as well.

A typical output waveform of the charge amplifier 24 is shown in FIG. 5. It is seen that initially the output is at zero volts prior to the application of a force. After the setup force is applied, the charge amplifier 24 maintains the analog voltage which corresponds to its value. A minimum of 170 milliseconds later the machine 12 delivers the bonding force. Its duration is typically 50 ms, but a minimum of 35 ms. The output of charge amplifier 24 increases by the difference between the bonding force and the setup force. At the end of this time, the dynamic force is removed, and only the setup force still remains. This is removed as well after an additional brief time.

In FIG. 4, the output of charge amplifier 24 is fed to sample and hold circuit 26, which is placed in a sample mode for 35 milliseconds after the beginning of a force event. The sample and hold output is read by the 3½ digit A to D converter 28 and held in memory 30. The contents of memory 30 are read out to liquid crystal display 32. One-shots 228, 230, 232, 234, 236 are used to control the timing of these blocks. The wire bond force 22 itself is used to start the chain of events. When force 22 is applied to transducer 20, the charge impulse results in a step function at the output of charge amplifier 24. This step is differentiated at capacitor 265 and resistor 266 and fed into comparator 226 setup as a threshold detector. The comparator 226 in turn triggers the one-shot chain 228, 230, 232, 234, 236 of the timing circuit 29.

In FIG. 10, a unique feature of meter 14 is the compensation feedback circuit 33 and its autozero/hold-balance function. While meter 14 is waiting for the next force event to occur, it is in the autozero mode. Analog switch A 788 is closed, which places a compensating network 676 in the charge amplifier feedback loop. The purpose of this network 676 is to sense any deviation of charge amplifier 24 from zero volts, and to provide immediate feedback bias current to drive it back. Also, during this time a second sample and hold circuit 714 take the average value of the feedback voltage. This average value is that voltage required to just balance the op amp and keep it from integrating to either power supply rail. The latter undesirable situation could occur in a short time if there were no compensation, since feedback capacitor 72 is so small. At the moment a force is sensed, the flip flop 622 changes state, opening analog switch A 788 and closing switch B 786. This removes the autozero compensation feedback and places the circuit in the hold-balance mode. That voltage previously determined to keep the charge amplifier 24 balanced is applied from the sample and hold unit 714. The idea is to keep the charge amplifier 24, which is now "on its own", from drifting significantly for the duration of the wire bonding event.

One type of wire bonding machine 12 used in this embodiment has a momentary pushbutton that the operator uses to initiate the wire bond. The button may be used in two ways. If it is simply pushed and released, then the setup/dynamic force sequence shown in FIG. 5 occurs automatically. However, if the button is pushed and held, then only the setup force will be applied. In the latter case, force meter 14 will measure and display only the setup force. The dynamic force will be applied when the operator finally releases the button. If the button was held down sufficiently long for meter 14 to autoreset and zero out while the setup force was still applied, then upon its release the difference between the bonding and setup force will be displayed.

Another feature which makes force meter 14 easy to use is event annunciator 31. This is a piezoelectric sound transducer 963 driven by a 2500 Hz oscillator. When a force pulse of 5 grams or higher is sensed by the meter 14, the one-shot timing chain 228, 230, 232, 234, 236 is triggered. At this time, an audible beep is generated. This gives the user some feedback indicating that the force has been recognized. Meter 14 would be silent without this indication. Since during a normal wire bond event, meter 14 is triggered twice, two successive beeps will normally be heard. However, in the case of measuring the setup force only, just a single beep will be heard. In the case of measuring the difference between the dynamic and static forces, two single beeps spaced far apart are heard. These indications give the user further audible feedback regarding what was measured.

FIGS. 6 and 7 show the circuit schematic diagram of this embodiment. The charge amplifier is implemented with amplifier 24 and capacitor 72 and their associated components. In this embodiment, amplifier 24 an operational amplifier with extremely low input bias currents of 1 picoampere maximum at 25 degrees Celsius and 250 femtoamperes typical. Resistors 67, 58, and 69, are used to null out the bulk of the residual offsets. Resistor 61 performs no circuit function, since the crystal impedance is extremely high, but protects the input of amplifier 24 from possible static damage due to the cable used for the transducer 20. The charge amplifier 24 is scaled by the value of capacitor 72 to achieve an output of 10 volts DC for a 1000 gram applied force.

Sample and hold unit 26 is a sample and hold intergrated circuit, the response time of which is dictated by resistor 162 and capacitor 166. This RC time constant is chosen such that any ringing on the charge amp output will be filtered out, yet the sample and hold unit 26 will approach 99.9% of its final value within 35 milliseconds. Resistor divider 186 and 198 scale the sample and hold output down by a factor of ten for the A/D converter 28, whose full scale input range is only 2.000 volts. The voltage at capacitor 206 is therefore 1 volt DC for the full 1000 gram applied force.

The 3½ digit A/D converter 28 plus memory 30 and LCD drivers section is implemented by means of unit U3. Resistor 517 and capacitor 513 in FIG. 7 are selected for an internal clock frequency of 240 kHz, which yields a A/D repetition rate of 15 samples per second. The A/D converter 28 also requires a precision reference of nominally 1.0 volt DC. This is created by resistors 554, 566, 568, 570, and diode 558 in FIG. 11. The zener diode 558 is a temperature compensated one for thermal stability.

Unit U3 in FIG. 7, which includes converter 28 and memory 30, takes analog samples continually. Unit U3 drives the liquid crystal display 32 directly. Display 32 in FIG. 7 is a 3½ digit LCD display with .5 inch high characters.

The compensated feedback network used for the autozero function is implemented by compensator 676, capacitor 706, and resistors 705, 698 and 710. This network passes high frequency components with a high gain and no phase shift, allowing for stiff negative feedback to damp them out. The loop is stable around zero volts DC nominally. The compensated network is switched into the circuit with analog switch 788. The resistor tee composed of resistors 904, 908 and 900 forms an equivalent resistor of 333 gigaohms. This high resistance is needed to finely adjust the low bias current needed by charge amplifier 24. In this case, 30 volts full scale would correspond to 10 picoamperes of available bias current.

The feedback sample and hold unit 714 in FIGS. 6 and 10, samples the output of the autozero compensation network during the autozero mode. The intent is that it settle to the average value of the network output. Unit 714 in FIGS. 6 and 10 is given a fairly large time constant of 150 milliseconds by resistor 750 and capacitor 752. This is large enough to filter out any sudden jumps of the compensation network due to sudden force applications, but small enough to allow the final voltage to be reached within 1.0 second. This hold-balance voltage is switched in by analog switch 786. The voltage is applied to the 333 gigaohm resistance during the hold-balance period.

Resistor dividers 826, 832, and 840, 846 are used to scale the +/−5 volt outputs of units 676 and 714 down to the +/−5 volt range which can be handled by the analog switches.

A force applied to the transducer/charge amp section will result in a voltage step, along with some ringing, at the charge amplifier output. This step is differentiated by capacitor 265 and resistor 266 and fed to the positive input of comparator 226. The negative input of comparator 226 is a +50 millivolt reference, corresponding to a 5 gram threshold. Whenever a step of greater than this amount is applied, comparator 226 will generate a positive-going pulse to trigger the first one-shot 228. The latter is set by capacitor 348 and resistor 352 to give a 35 millisecond pulse, which is used to activate the sample and hold unit 26. The second one-shot of the pair, which is triggered at the same time as the first, generates a 150 millisecond pulse. This is used for two things. Firstly, it inhibits the first one-shot from accepting any further pulses during this time. This is necessary since the charge amplifier's ringing might cause undesirable retriggering. The ringing always damps out in less than 150 milliseconds. Secondly, the 150 ms pulse is used to gate the 2500 Hz oscillator driving the sound transducer. This length of time is short enough so that the resulting beep does not annoy the operator.

At the end of the 35 ms sampling time, the sample and hold unit 26 has settled to its final value. It is now switched to its hold state, and it is desired to update the A/D memory 30. At this time units 228, 230 trigger the one-shot unit 232, which is set for a 140 millisecond duration. The purpose of unit 232 is to update the memory section 28 of the unit U3 by bringing the HOLDR input low. Since the A/D converter 28 acquires 15 samples per second, or 67 ms per sample, in a freerunning mode, and since it is necessary to capture at least one complete sample, the HOLDR pin is released for a little more than 133 ms, the time for two samples to occur.

The autoreset function is implemented by the one-shots of units 234, 236 and associated components. The first one-shot 234 is triggered at the start of a force event. It is set by capacitor 470 and resistor 474 for a pulse length of 833 milli seconds, which is a greater length of time than any wire bond event which might occur. At the end of this time the second one-shot 236, set for 100 ms, is triggered. This reset pulse is used for three functions. Firstly, it closes relay 78 and 178 for a fraction of a second, so that the charge amplifier 24 and sample and hold 26 sections are reset to zero. This is necessary, since it would take the autozero circuit approximately 40 seconds to drive the charge amplifier 24 to zero from a rail all by itself. Once zeroed, the autozero circuit 33 can maintain the null with a short time constant of roughly 250 milliseconds. Secondly, it resets the flip flop 622, composed of NAND gates 626, 624, which puts the input section back to the autozero mode. Autozeroing resumes as soon as the relay is released. Thirdly, the pulse inhibits the one-shots 228, 230 during the autoreset period, so that no glitches caused by the opening and closing of relay 78, 178 can be interpreted as a new force event. For this function, the pulse is stretched by resistor 657 and capacitor 650 and diode 660 for an additional 750 milli seconds. This also allows the autozero circuit to finish damping out any remaining oscillation which might cause unwanted triggering. No new force events will be recognized during this time. Diode 647 discharges capacitor 650 at power-down to protect one-shots 228, 230.

Resistor 604, capacitor 606 and diode 610 are used for the powerup reset function. This 1.7 second time constant keeps all of the one-shot inhibited while the power supplies are coming up to prevent false triggering. It also ensures that the relay 78, 178 resets the charge amplifier 24 and sample and hold 26, and that the force meter is initially set to the autozero mode. In addition, the HOLDR input of the A/D converter 28 is held low for this time, allowing the LCD display 32 to be initialized to a 000 reading.

Semiconductors 792, 790 and their biasing resistors are level shifters required by the analog switches, since their Vss rails are tied to −5 volts rather than ground like the other CMOS devices in the circuit.

The piezoelectric sound transducer 963 is a crystal designed to resonate when an AC voltage of 2500 Hz is placed across it. It is driven by the gated oscillator made up of elements 952, 954, resistors 972, 976, 951, 957, 975, capacitor 988, and semiconductor 956.

The calibration of the force meter 14 is indicated hereafter. There are three calibrations which must be performed on the force meter. All potentiometers and switches for these adjustments are located inside the case, and inaccessible to the operator. This minimizes the chances of inadvertent miscalibration. The calibrations must be performed in the order described here.

(1) The first calibration is the adjustment of the offset of charge amplifier 24. This is done by varying resistor 58 for a nominal value of zero volts at TP1 while in the autozero mode. This adjustment is not very critical, since the autozero function will dynamically fine adjust the offset up to a point.

(2) The second calibration is that of nulling out the offset error of the output reading. Components of this offset may be attributed to offsets of compensation unit 676 and sample and hold 26. These are removed by adjusting resistor 152 for a nominally zero reading at TP2 while in the autozero mode and with switch in the "cal offset" position. The reading 000 should also be seen on the display when this is accomplished.

(3) The third and final calibration is that of setting the gain of the meter. The obvious approach of applying a reference weight to the transducer by hand and observing the display reading does not work since the weight will bounce no matter how skillfully the technician drops it. The method employed here is that of the removal of the weight, which can be done much more swiftly and cleanly, for example, by yanking it off with a light string. Switch at contacts 246, 248 is first set to the "cal gain" position. Then a 1000 gram calibrated weight is applied to the force transducer 20, and the meter 14 allowed to go into the autozero mode. The charge amplifier 24 is zeroed with the weight applied. When the weight is removed suddenly, the charge amplifier 24 produces a negative step voltage of roughly 10 volts. Since the "−" sign on the display is suppressed, a readout of nominally 1000 will be seen on the display. The purpose of the switch at contacts 246, 248 is to invert the polarity of the comparator 226, so that the event will be triggered by a negative-going pulse instead of a normal positive-going one.

The gain is set by repeating the weight removal procedure, while potentiometer 568 is adjusted for a reading of 1000 on the liquid crystal display.

The error contributions to the gain error include variations in force transducer sensitivity, the tolerance of capacitor 72, the tolerance of the resistors 186, 198 voltage divider, and reference zener 558 tolerance. Since the gain of the meter is calibrated with a particular force transducer connected, interchangeability of meters and transducers is not permissible without recalibration.

The advantages of assembly 10 are indicated hereafter.

1. Meter 14 has the benefits of high accuracy, ease of use, and portability. The forces measured are consistent and repetitive. Its ease of use stems from the inclusion of autozero and autoreset functions. There are no controls on the front panel of meter 14 except for the power switch. The operator may take successive measurements indefinitely without having to manually reset anything. Meter 14 is housed compactly in a relatively small case 38 with its transducer 20 connected to the back of its case 38 through a short cable 36.

2. Meter 14 has an audible annunciator 31 which gives the operator a good indication that a force measurement has been performed.

3. Meter 14 is used in this embodiment to measure the transient forces encountered during the wire bonding of dice in hybrid microcircuits. The meter 14 in this embodiment has a useful range of 5 grams to 1200 grams. The measured result is displayed on a liquid crystal readout 32 mounted on the front panel of its case 38. Meter 14 also has autozero and autoreset functions, which make meter 14 extremely simple to use.

4. Assembly 10 using meter 14 provides a way to measure a dynamic bonding force, and a way to automatically measure a static setup force, thereby overcoming the problems of the prior art bonding machine.

While the invention has been described in its preferred embodiments, it is to be understood that the words which have been used are words of description rather than limitations and that changes may be made within the purview of the appended claims without departing from the true scope and spirit of the invention in its broader aspects.

The embodiment of an invention in which an exclusive property or right is claimed are defined as follows:

1. A wire bonding force calibration for measuring a force applied thereto comprising:
   a transducer for sensing a force applied thereto and having an output;
   a charge amplifier having an input connected to the output of the transducer and having an output;
   a sample and hold unit having a first input connected to the output of the charge amplifier and having a second input and having an output;
   an analog to digital converter having an input connected to the output of the sample and hold unit and having an output;
   a memory unit having a first input connected to the output of the converter and having a second input and having an output;
   a display having an input connected to the output of the memory unit; and
   a timing circuit having an input connected to the output of the charge amplifier and having a first output connected to the second input of the sample and hold unit and having a second output connected to the second input of the memory unit and having a third output and having a fourth output and having a fifth output.

2. The meter of claim 1, including:
   a compensation feedback circuit having a first input connected to the output of the charge amplifier and having a second input connected to the third output of the timing circuit and having a third input connected to the fourth output of the timing circuit.

3. The meter of claim 2, including:
   an event annunciator circuit having an input connected to the fifth output of the timing circuit.

4. The meter of claim 3, wherein the timing circuit includes:
   a trigger threshold unit having an output;
   a comparator having a first input connected to the output of the trigger threshold unit and having a second input connected to the output of the charge amplifier and having an output; and
   a chain of one-shot units having an input connected to the output of the comparator.

5. The meter of claim 4, wherein the chain of one-shot units include:
   a first one-shot unit having an input connected to the output of the comparator and having a first output connected to the second input of the sample and hold unit and having a second output and having a third output connected to the second input of the compensation feedback circuit and having a fourth output and having a fifth output;
   a second one-shot unit having an input connected to the second output of the first one-shot unit and having an output connected to the second input of the memory unit;
   a third one-shot unit having an input connected to the fourth output of the first one-shot unit and having an output;
   a fourth one-shot unit having an input connected to the output of the third one-shot unit and having an output connected to the third input of the compensation feedback circuit; and
   a fifth one-shot unit having an input connected to the fifth output of the first one-shot unit and having an output connected to the event annunciator circuit.

6. The meter of claim 5, wherein the compensation feedback circuit includes:
   an autoset unit having an output connected to the input of the charge amplifier and having a first input and a second input and a third input and a fourth input;
   a compensation network having an input connected to the output of the charge amplifier and having a first output connected to the third input of the autoset unit and having a second output;
   a feedback sample and hold unit having an input connected to the second output of the compensation network and having an output connected to the second input of the autoset unit; and
   a flip flop unit having a first input connected to the third output of the first one-shot unit and having a second input connected to the output of the fourth one-shot unit and having a first output connected to the first input of the autoset unit and having a second output connected to the fourth input of the autoset unit.

7. The meter of claim 5, wherein the event annunciator circuit includes:
   an oscillator having an input connected to the output of the fifth one-shot unit and having an output; and
   a piezoelectric sound transducer having an input connected to the output of the oscillator.

* * * * *